(12) United States Patent
Torii

(10) Patent No.: US 12,449,727 B2
(45) Date of Patent: Oct. 21, 2025

(54) IMPRINT APPARATUS, MANUFACTURING METHOD FOR ARTICLE, AND COMPUTER PROGRAM

(71) Applicant: CANON KABUSHIKI KAISHA, Tokyo (JP)

(72) Inventor: Hirotoshi Torii, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/877,283

(22) Filed: Jul. 29, 2022

(65) Prior Publication Data
US 2023/0066484 A1    Mar. 2, 2023

(30) Foreign Application Priority Data

Aug. 25, 2021 (JP) ................................. 2021-137299

(51) Int. Cl.
*G03F 7/00* (2006.01)
(52) U.S. Cl.
CPC .................. *G03F 7/0002* (2013.01)
(58) Field of Classification Search
CPC ................................................... G03F 7/0002
See application file for complete search history.

(56) References Cited

U.S. PATENT DOCUMENTS

| | | | |
|---|---|---|---|
| 7,170,589 B2 | 1/2007 | Cherala et al. | |
| 8,043,085 B2 | 10/2011 | Kruijt-Stegeman et al. | |
| 2005/0270516 A1* | 12/2005 | Cherala | B82Y 10/00 355/72 |
| 2008/0122138 A1* | 5/2008 | Zhang | B29C 59/022 425/149 |
| 2010/0044917 A1* | 2/2010 | Kruijt-Stegeman | B82Y 40/00 264/293 |

(Continued)

FOREIGN PATENT DOCUMENTS

| | | |
|---|---|---|
| JP | 2008504141 A | 2/2008 |
| JP | 2010080918 A | 4/2010 |

(Continued)

OTHER PUBLICATIONS

Festo Product information in brief Proportional pressure regulator VPPM (Year: 2012).*
WO-9639294-A1 English translation (Year: 1996).*

*Primary Examiner* — Susan D Leong
*Assistant Examiner* — John W Hatch
(74) *Attorney, Agent, or Firm* — ROSSI, KIMMS & McDOWELL LLP

(57) ABSTRACT

[Problem] The provision of an imprint apparatus that is beneficial in improving the overlap precision of a mold and resin on a substrate.
[Method for Solving the Problem] In an imprint apparatus, which is configured so as to transfer a pattern from a mold onto a resin surface by pressing the mold onto the resin that is disposed on the substate surface, has a magnification correction mechanism including actuators for applying a force to a side of the mold via a contact member, and correcting the shape of a patterned portion that has been formed on the mold; and displacement members displaceable by fluid pressure for changing an initial position for starting correction of the contact members of the magnification correction unit according to a size of the mold.

16 Claims, 13 Drawing Sheets

(56) References Cited

U.S. PATENT DOCUMENTS

2013/0300031 A1* 11/2013 Torii .................. B29C 59/026
  264/293
2015/0368417 A1* 12/2015 Omenetto ............ G03F 7/0002
  101/463.1

FOREIGN PATENT DOCUMENTS

JP         2019079875 A      5/2019
WO       WO-9639294 A1 *  12/1996    ............. B29C 63/02

* cited by examiner

B-B CROSS SECTION

C-C CROSS SECTION

D-D CROSS SECTION

C-C CROSS SECTION

IMPRINT APPARATUS, MANUFACTURING METHOD FOR ARTICLE, AND COMPUTER PROGRAM

BACKGROUND OF THE INVENTION

Field of the Invention

The present invention relates to an imprint apparatus, a manufacturing method for an article, a computer program, and the like.

Description of Related Art

As the demand for the miniaturization of semiconductor devices, MEMS and the like continues, in addition to conventional photolithographic technologies, microfabrication technologies that form uncured resin on a substrate using a mold (impression), and form a resin pattern on the substrate have been gaining attention. This type of technology is also referred to as an imprint technology, and is able to form microstructures of an order of several nanometers on a substrate.

One imprint technology is, for example, a light curing method. In imprint apparatuses that use these light curing methods, the shot, which is the imprint region on the substrate (wafer), is first coated with an ultraviolet curing resin (imprint material, photocurable resin). Next, this resin (the uncured resin) is formed using a mold. Then, a resin pattern is formed on the substrate by separating the resin after curing it by irradiation with ultraviolet light.

In this context, there are cases in which, in a serial manufacturing process for a device, a substrate that has had imprint processing performed on it is, for example, passed through heat processing during a film forming process such as sputtering or the like, and the entirety of the substrate is thereby enlarged or shrunk, and the magnification (size) of the pattern is altered in two axial directions that are orthogonal to each other within a horizontal plane. Accordingly, in the imprint apparatus, it is necessary to match the magnification of the pattern that is formed on the substrate and the magnification of the patterned portion that is formed on the mold, and the like, when pressing together the mold and the resin on the substrate.

In conventional projection type lithographic devices, such a correction of the magnification is accommodated by changing the reduction magnification of the optical projection system to match the magnification of the substrate, or by changing each shot size at the time of the lithographic processing by changing the scanning rate of the substrate stage. However, imprint apparatuses do not have optical projection systems, and instead directly contact the mold and the resin on the substrate, and therefore, are unable to execute magnification correction in this manner. Therefore, imprint apparatuses employ magnification correction mechanisms that physically change the mold by applying an external force to a side of the mold.

For example, a case will be considered in which the manufacturing process for a semiconductor device with a half pitch of an extent of 32 nm is applied to the imprint apparatus. At this time, according to the ITRS (International Technology Roadmap for Semiconductors), the overlapping accuracy is 6.4 nm. Therefore, in order to accommodate this, it is necessary to also execute the magnification correction at a precision of several nm or less. In order to perform the magnification correction with such a high degree of precision, a piezo actuator with a high driving resolution is employed.

In contrast, a plurality of molds is used in imprint apparatuses, and therefore, a system in which the molds are exchangeable is used. Due to this, it is necessary to provide a gap between the pressing unit of the magnification correction mechanism and the mold when exchanging the molds. In addition, the molds include calculation errors in the external dimensions and calculation errors in the exchange position, and it is therefore necessary to secure a gap that accounts for these. However, piezo actuators are limited to a drive amount corresponding to their entire length, and therefore, it is difficult to obtain large strokes without changing the size of the apparatus. According to Japanese Unexamined Patent Application, First Publication No. 2010-080918, an apparatus has a first actuator on the outer periphery of the mold for performing magnification corrections, and a second actuator with a larger range of movement than the first actuator. In addition, it is made possible to realize high strokes by serially connecting each actuator, and applying a force to the external periphery of the mold.

However, in the configuration that is disclosed in Japanese Unexamined Patent Application, First Publication No. 2010-080918, it is difficult to effectively realize high strokes in a limited space. For example, in a nanoimprint, the thickness of the mold is thin, and the actuator cannot be disposed so as to protrude on the wafer side, and therefore, this is realized by disposing the actuator on the opposing side of the wafer, and rotating it around a fulcrum using a lever mechanism, as in Published Japanese Translation No. 2008-504141 of the PCT International Publication. Therefore, it is difficult to simply dispose an actuator on a two-stage series.

FIG. 1 is a diagram for explaining the measurement errors for a contacting portion of an actuator and a mold, and as is shown in FIG. 1, the mold, or the contacting portion for the mold of the plurality of magnification correction mechanisms (actuators) have shape errors due to manufacturing. Due to this, when the side of the mold is pressed by the magnification correction mechanisms (actuators), the shape of the mold becomes uneven, and the overlapping precision is considerably degraded. In the case in which the pressing force of the actuators is further controlled with a force sensor, the mold position will be altered due to a change in the contact state, an alignment error will occur, and eventually the overlapping accuracy will also be degraded. It is also possible to dispose a large number of second actuators in a series and correct the first angle error in order to supress these errors. However, this inevitably complicates the configuration and enlarges the apparatus.

SUMMARY OF THE INVENTION

The present invention takes into account such a situation, and aims to provide an imprint apparatus with an improved overlapping precision for the mold and the resin on the substrate.

In order to solve the above-described problem, the present invention is an imprint apparatus configured so as to transfer a pattern of a mold onto resin surface by pressing the mold onto the resin that has been arranged on a surface of a substrate, wherein the imprint apparatus has a magnification correction mechanism including an actuator that applies a force to a side of the mold via a contact member in order to correct a shape of a patterned portion that has been formed on the mold; and a displacement member displaceable by fluid pressure for changing an initial position for starting correction of the contact member of the magnification correction mechanism according to a size of the mold.

Further features of the present invention will become apparent from the following description of exemplary embodiments with reference to the attached drawings.

DESCRIPTION OF THE EMBODIMENTS

Below, preferred modes for implementing the present invention will be explained using embodiments with reference to the attached drawings. Note that in each figure, the same reference numbers have been attached to the same members and elements, and redundant explanations will be omitted or simplified.

The First Embodiment

Figure 1:
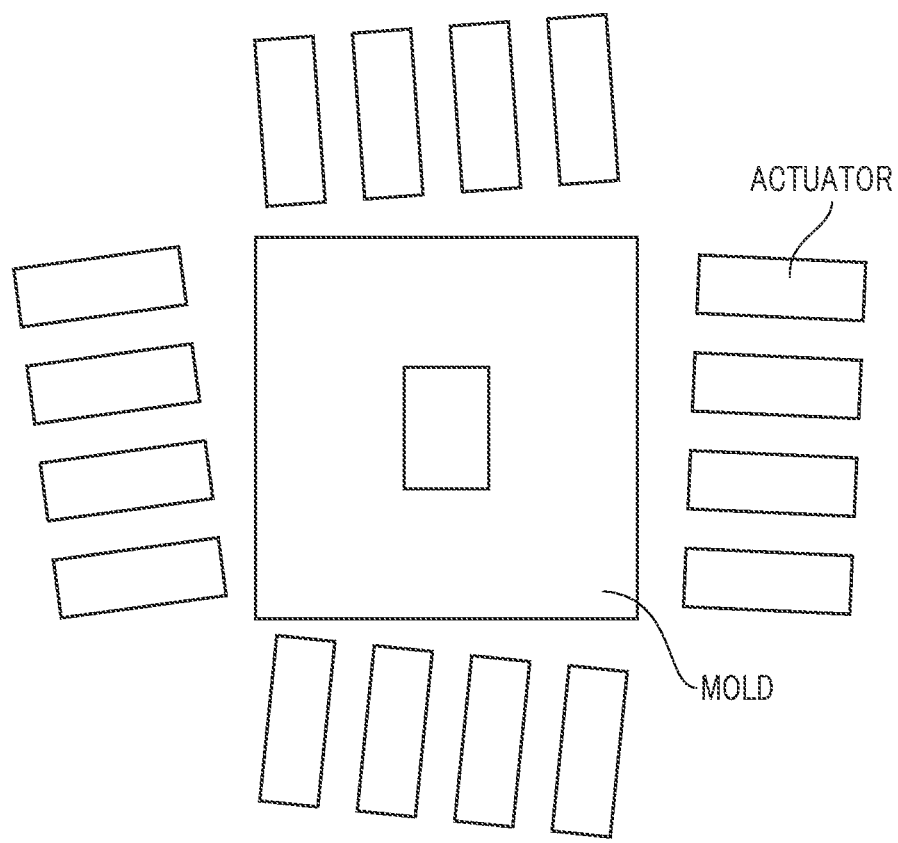
FIG. 1 is a diagram for explaining the errors for a contacting portion between an actuator and a mold.
Figure 2:
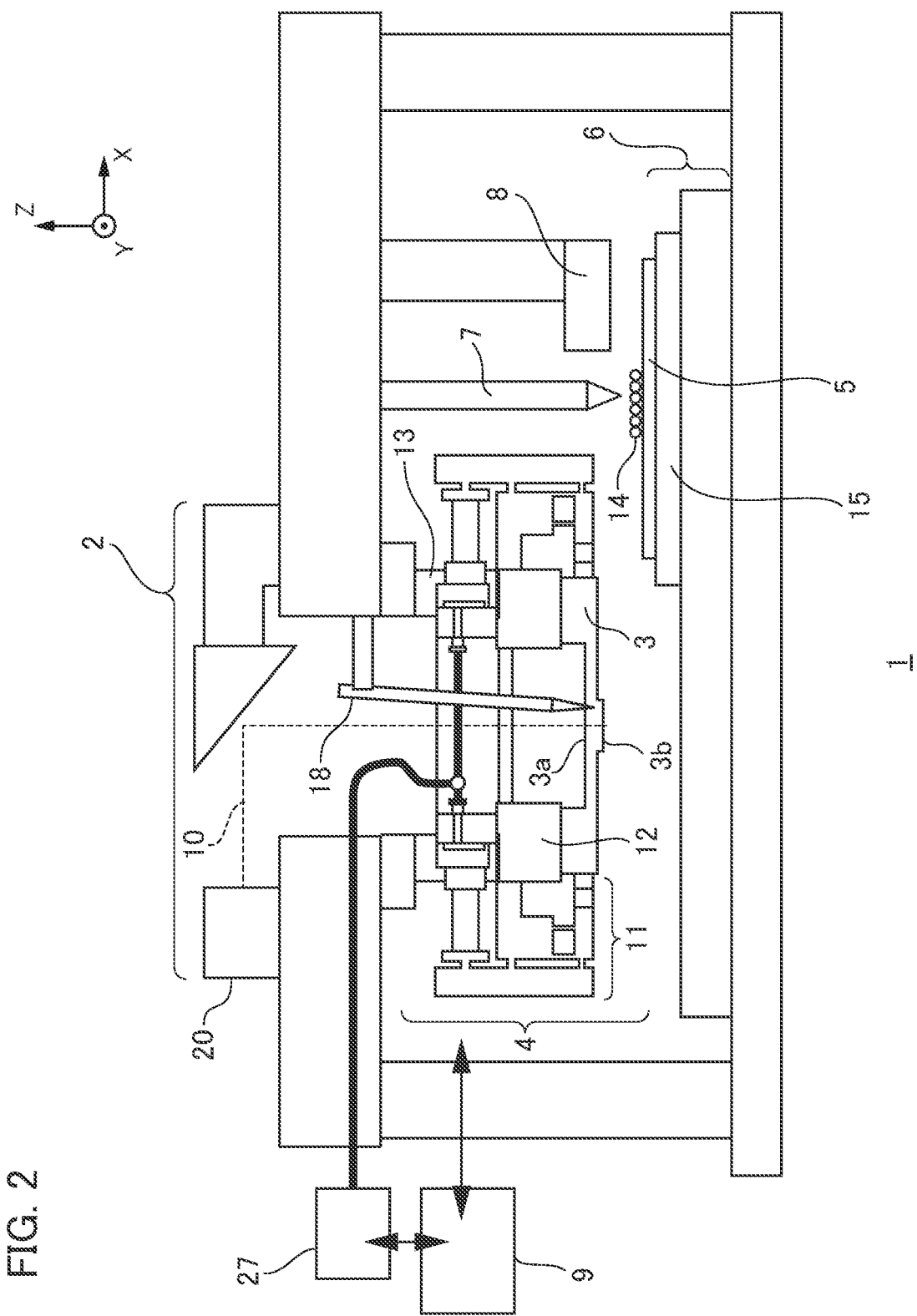
FIG. 2 is a configurational diagram showing a configuration of an imprint apparatus according to a First Embodiment of the present invention.

First, the configuration of an imprint apparatus according to a First Embodiment of the present invention will be explained. FIG. 2 is a configurational diagram showing a configuration of an imprint apparatus according to the First Embodiment of the present invention. The imprint apparatus in the First Embodiment is an apparatus that is used in a semiconductor device manufacturing process, wherein a concavo-convex pattern of a mold is pressed onto an imprint material (resin, resist) of a substrate surface (wafer surface) that is a substrate to be processed. In addition, the apparatus is also a processing apparatus that thereby transfers the pattern of the mold onto the resin surface, and an apparatus that employs a light curing method in an imprint technology as well.

Note that, in the figures below, an explanation is given assuming that the Z axis is parallel to the irradiation axis of the ultraviolet light on the mold, that the X axis is the movement direction of the wafer against a mold chuck, which will be described below, in a plane that is perpendicular to the Z axis, and that the Y axis is the direction that is orthogonal to the X axis. An imprint apparatus 1 in the First Embodiment is provided with a lighting system unit 2, a mold 3, an imprint head 4, a wafer 5, a wafer stage 6, a coating device 7, a mold transport device 8, and a control device 9.

The lighting system unit 2 is a lighting means that irradiates the mold 3 with an ultraviolet light 10 during imprint processing. This lighting system unit 2 is configured by a light source 20, and a plurality of optical elements for irradiation using an ultraviolet light that is emitted from the light source with an appropriate amount of light for imprinting. In addition, the outer periphery of the mold 3 is rectangularly shaped, the mold 3 has a protruding portion 3b of several dozen um on the surface that opposes the wafer 5, and a specific pattern (for example a concavo-convex pattern such a circuit pattern or the like) is 3-dimensionally formed on the protruding portion 3b.

The surface of the concavo-convex pattern is fabricated to a high degree of flatness in order to maintain its adhesion to the surface of the wafer 5. A hollow portion 3a is provided on the mold 3, and it is possible to shorten the filling time for the resist (imprint material, resin) into the concavo-convex pattern by pressuring while expanding the hollow portion 3a. Note that the material for the mold 3 is a material such as quartz or the like that is permeable by ultraviolet light.

The imprint head 4 is provided with the mold 3, a magnification correction mechanism 11 that corrects the concavo-convex pattern that has been formed on the mold 3 into a desired shape by applying a compression force to the mold 3, and a mold holding member 12 that attracts and thereby holds the mold 3 using a suctioning force or a static electric force.

In addition, the imprint head 4 is provided with a pressing actuator 13 for driving the mold holding member 12. The pressing actuator 13 makes it possible to drive the mold holding member 12 in the Z axis direction in order to press the mold 3 onto the UV curable resin that has been formed on the wafer 5. The pressing actuator is preferably a linear motor.

The wafer 5 is, for example, a substrate to be processed consisting of single crystal silicon, and the side to be processed is coated with a UV curable resin (referred to below as simply "resin") to serve as the imprint material that will become the formed portion.

In addition, it is possible to use a linear motor as the actuator for driving the wafer stage 6 so as to be able to move freely within the XY plane, however, the configuration is not particularly limited thereto. A wafer holding member 15 is positioned on the wafer stage 6, and holds the wafer 5 by vacuum suction.

In addition, the coating device (dispenser) 7 is a coating means that coats the top of the wafer 5 with uncured resin 14. The resin is a photo-curable resin (imprint material) having the property of being cured by receiving UV light rays, and the photocuring characteristics and the like are suitably selected based on the type of semiconductor device to be manufactured. Furthermore, the mold transport device 8 is a transportation means that transports the mold from an external part, and positions the mold 3 in relation to the mold holding member 12.

In standard imprint processing, the mold 3 is pressed onto the resin 14 with which the wafer 5 has been coated. When the wafer 5 and the mold 3 are pressed together, their relative positions in the horizontal direction are joined together by the overlap of alignment marks with which both have been provided being measured by an alignment scope 18 that has been provided inside the imprint head 4, and the stage position being controlled such that it is at a desired position.

The control device 9 is a control unit that controls the operations, adjustment, and the like of each configurational element of the imprint apparatus 1 based on the measurement values from each detection device. Although it is not illustrated, the control device 9 is connected to each of the configurational elements of the imprint apparatus 1 by a circuit, and is configured by a computer, a sequencer, or the like having a storage unit such as a magnetic storage medium, a semi-conductor memory, or the like. In addition, the control of each of the configurational elements is executed based on a computer program or a sequence that has been stored on the storage unit. The control device 9 may be configured as one device together with the imprint apparatus 1, or it may be disposed in a separate location from, and configured so as to remotely control the imprint apparatus 1.

Figure 3:
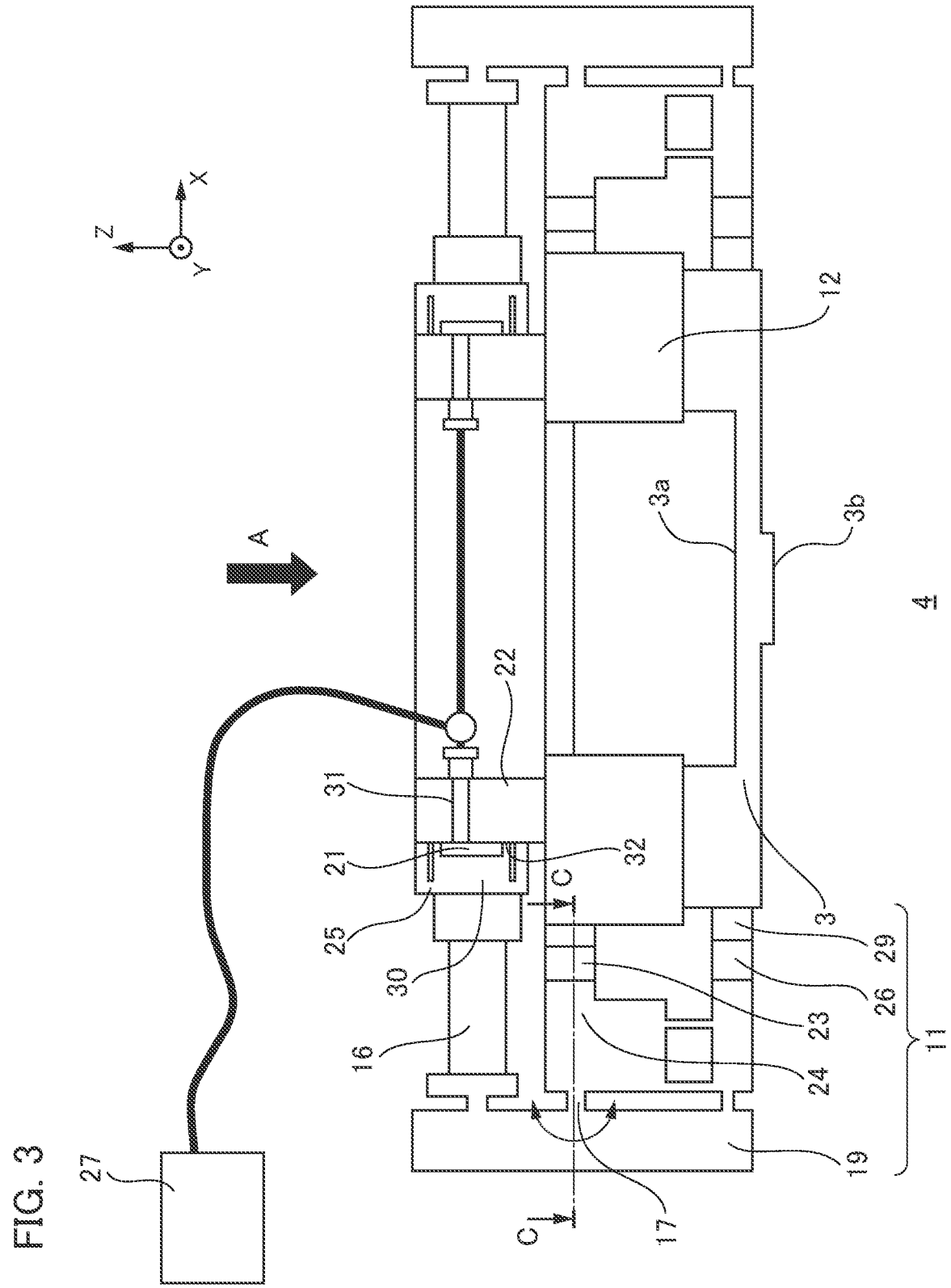
FIG. 3 is a side view diagram of an imprint head 4 and a magnification correction mechanism 11 according to the First Embodiment.
Figure 4A:
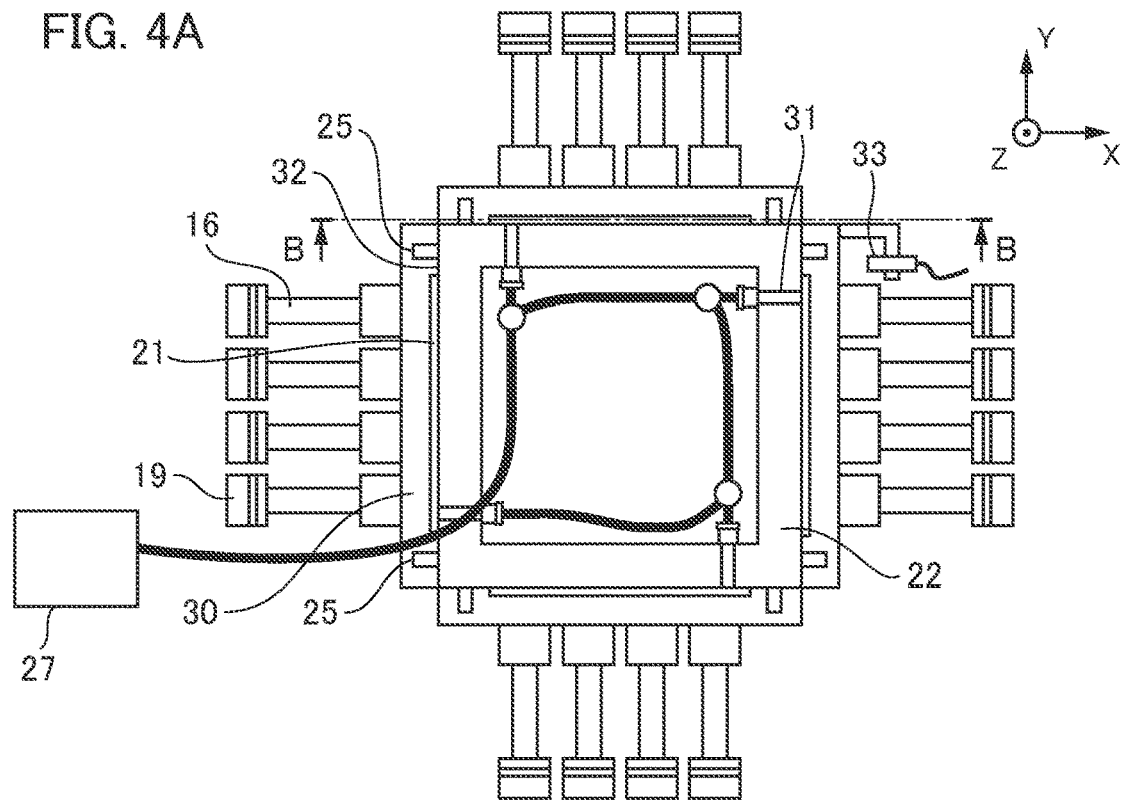
FIG. 4A is a diagram as seen from the direction of the arrow A of FIG. 3.
Figure 4B:
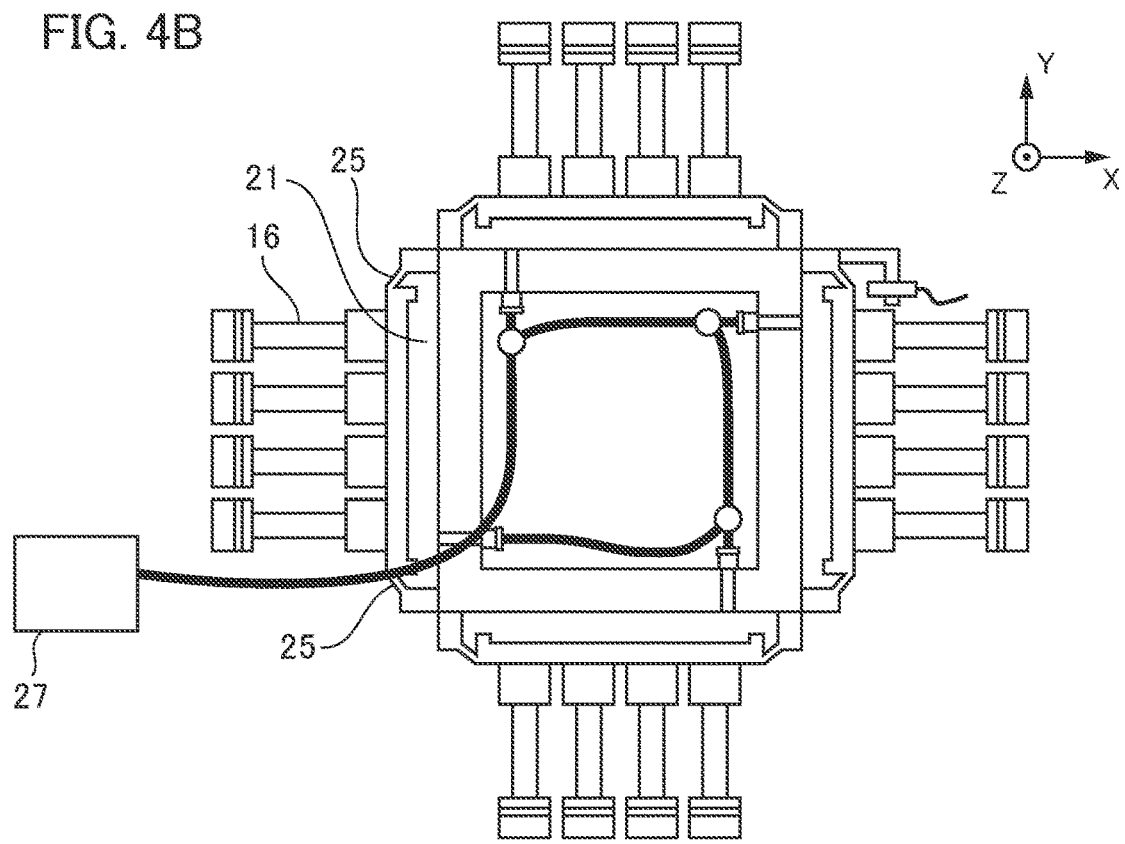
FIG. 4B is a diagram showing a simulation of the shape in the case in which positive pressure has been applied to a chamber 21 in FIG. 4A.
Figure 5A:
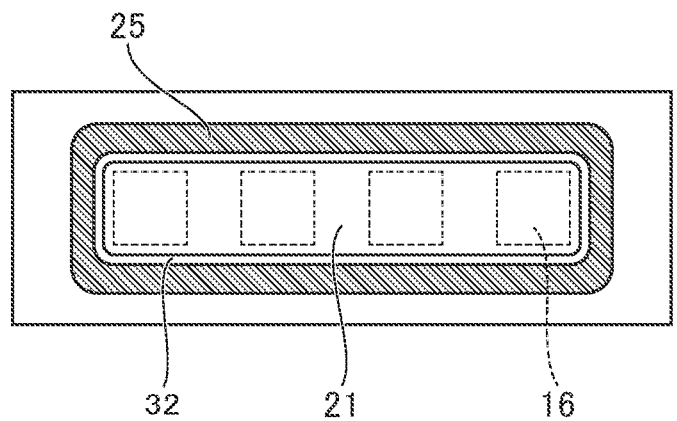
FIG. 5A is a diagram of the B-B cross section in FIG. 4A.
Figure 5B:
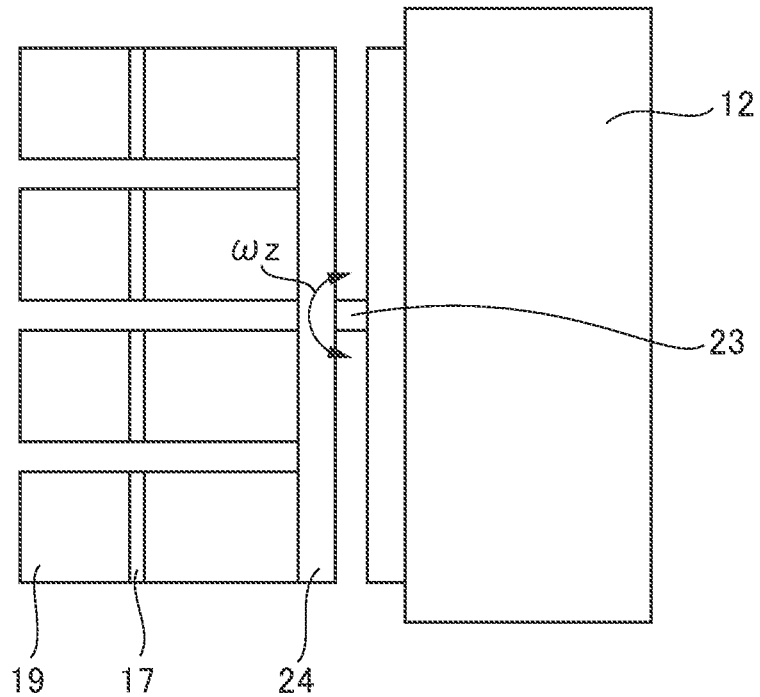
FIG. 5B is a diagram of the C-C cross section in FIG. 3.

FIG. 3 is a side view diagram of the imprint head 4 and the magnification correction mechanism 11 according to the First Embodiment. In addition, FIG. 4A is a diagram as seen from the direction of the arrow A in FIG. 3. FIG. 4B is a diagram showing a simulation of the shape in the case in which positive pressure has been applied to a chamber 21 from FIG. 4A. FIG. 5A is a diagram of the B-B cross section in FIG. 4A. FIG. 5B is a diagram of the C-C cross section in FIG. 3.

In FIGS. 3 to 5, actuators 16 for applying a pressing force from the side of the mold 3 are incorporated into the magnification correction mechanism 11, and four sets are disposed per one side of the mold 3. As was explained above, due to the thickness of the mold and dimensional limitations of the wafer side, the actuators 16 are disposed more on the positive side of the Z axis than the horizontal position of the protruding portion 3b of the mold. Additionally, the generating force of the actuators 16 is transmitted to the side of the mold 3 via a contact member 29 via a lever 19 that rotates centered on a hinge 17. Accordingly, the mold 3 is compressed and deformed by the expansion of the actuators 16.

In this context, the present example employs an elastic hinge that uses elastic deformation. However, a hinge that uses an axis and bearing may also be used. An actuator that can be driven by the high responsivity and high resolution of the piezo elements and the like is used as the actuators 16. In contrast, the responsivity and resolution of the displacement of the displacement unit due to the pressure adjusting unit is relatively low. That is, the responsivity and resolution of the correction of the shape by the magnification correction mechanism 11 are respectively higher than the responsivity and the resolution of the displacement of the displacement unit due to the pressure adjusting unit. In addition, the responsivity of the fluid deformation is slower than that of the piezo elements and the like, and therefore, it is made such that the initial position of the drive mechanism is changed by using the displacement of the displacement unit, which has a slower responsivity than the magnification correction mechanism.

The load cell 26 is a load cell for measuring the compression force towards the mold, and is disposed between the lever 19 and the contact member 29. The output of the actuator is controlled based on the compression force towards the mold that has been measured by the load cell 26.

The hinge 17 is connected to the mold holding member 12 via a base 24.

In this context, as is shown in FIG. 5B, a flexure unit 23 is provided between the mold holding member 12 and the base 24 in order to facilitate the deformation of the magnification correction mechanism 11 in the ωz direction. The flexure unit is formed by, for example, a thin board of 2 mm or less.

The four actuators 16 that are provided on each edge of the mold 3 are able to rotate centered on this flexure unit 23, and it is therefore possible to perform pressing in accordance with the shape of the mold sides even in the case in which there is an angle error for the sides of the mold for each side and the ωz direction of the contact member 29 and the mold. Therefore, it is possible to control non-uniform deformation and misalignment of the rotation direction positions for the mold when pressing is being performed. The actuator 16 is fixed to a frame 22 via a concave member 30. The frame 22 is held by the mold holding member 12.

The concave member 30 has a membrane 25 and a concave unit, and a chamber 21 is formed by the concave member being connected to the frame 22 via a bank 32.

The frame 22 is provided with an opening 31, and is connected to a pressure adjustment mechanism 27 that serves as a pressure adjusting unit for adjusting the fluid pressure of the chamber 21 via a joint and piping. The membrane 25 is formed by the hollow portion of the concave member 30. The thickness of the membrane 25 is 2 mm or less, and the concave member 30 is thereby able to be flexibly deformed in response to the pressure inside the chamber 21. In this context, the frame 22 and the concave member 30 are configured by separate members. However, they may also be configured as one. The area itself of the concave member 30 to which a plurality of actuators 16 is attached is made thicker than the membrane 25, and controls the deformation of the parts other than the membrane.

In addition, an O-ring and an adhesive, which are not illustrated, may also be used on the connective part in order to maintain the airtightness of the chamber 21. In the First Embodiment, each of the four sides of the mold 3 have a concave member 30 that serves as a displacement member, four chambers 21 are formed and made spaces with a shared pressure that is the same and that are connected to each other by piping, and this pressure can be adjusted using the pressure adjustment mechanism 27. The pressure adjustment mechanism 27 in the First Embodiment is a configuration for adjusting the air pressure inside the chambers 21. However, it is also possible to use a fluid such as water, oil, or the like as the medium in the space instead of air. The pressure adjustment mechanism 27 is configured by pumps and bulbs which are not illustrated, a pressure adjusting valve, and a pressure sensor, and it is possible to adjust the inside of the chamber to an arbitrary fluid pressure.

In the case in which positive pressure has been applied to the chamber 21, the position of the actuator 16 will move parallelly to the outer side from the center of the mold, as is shown in FIG. 4B, the lever 19 will rotate, and the contact member 29 will move in the direction towards the side of the mold 3. That is, the pressure adjusting unit is able to change the distance between the contact member 29 and the side of the mold 3 using the displacement member by adjusting the fluid pressure. Note that the displacement member is displaced parallelly to the expansion direction of the actuator 16. Due to such a configuration, unlike in a regular cylinder, a guide unit is not necessary, and it is possible to realize parallel movement with a compact and simple configuration.

In the present example, in a state in which positive pressure is not being applied, although the bank 32 of the concave member is contacting the frame 22 side, a gap may be provided. In this case, it is possible to apply negative pressure to the chamber 21 and to also displace the contact member 29 in a direction away from the side of the mold 3. As has been previously described, FIG. 4B is a diagram showing the state in the case in which positive pressure has been applied to the chamber 21 from FIG. 4A.

By the membrane 25 being warped by positive pressure, it is possible to increase the space of the chamber 21 and to move the actuator 16 to the outside as in FIG. 4B. In this manner, it is possible to move the position of the actuator 16 by changing the pressure of the chamber space, and to change the position of the contact member 29 in relation to the mold 3 by rotating the lever 19.

For example, when the mold is being exchanged, in the case in which displacement is performed in the direction away from the contact member 29 and the side of the mold 3, and the side of the mold is pressed, positive pressure may be applied to the chamber 21 so as to make the contact member 29 move towards the mold 3. In this manner, in the First Embodiment, a concave member 30 is provided as a displacement member that is displaceable using fluid pressure. In addition, the concave member 30 that serves as the displacement member is displaceably disposed in a position on one end side of the actuator 16, and changes the initial position for starting the adjustment of the contact member 29 of the magnification adjustment mechanism in response to the size of the mold 3.

Furthermore, instead of just moving closer to the mold 3, the contact member 29 may also actually apply a pressing force to the mold 3 due to the chamber pressure. However, in terms of precision, control by pressure is relatively rough and has a low frequency, and therefore, it is preferable to perform magnification adjustment using the actuator 16 with high precision and a high frequency thereafter. In addition, position detecting sensors 33 may also be provided to measure the deformation amount of the chamber and the movement amount of the actuator 16 due to the pressure changes in the chamber 21. It is thereby possible to control the deformation amount of the concave member 30 and the output balance of the actuator 16.

Second Embodiment

Next, an imprint apparatus according to a Second Embodiment of the present invention will be explained using FIG. 6 and FIG. 7. The imprint apparatus according to the Second Embodiment is characterized by the point that the configuration of the chamber 21 from the First Embodiment has been changed.

Figure 6A:
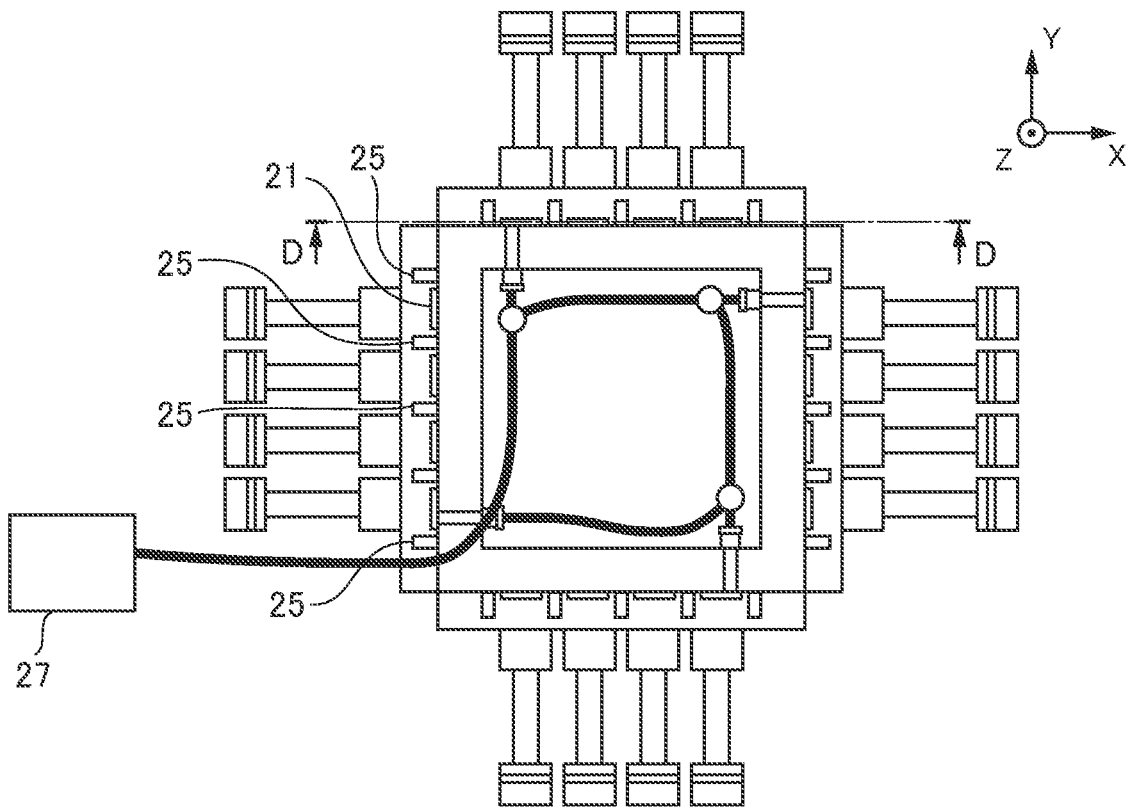
FIG. 6A is a diagram as seen from the direction of the arrow A in FIG. 3 in a Second Embodiment.
Figure 6B:
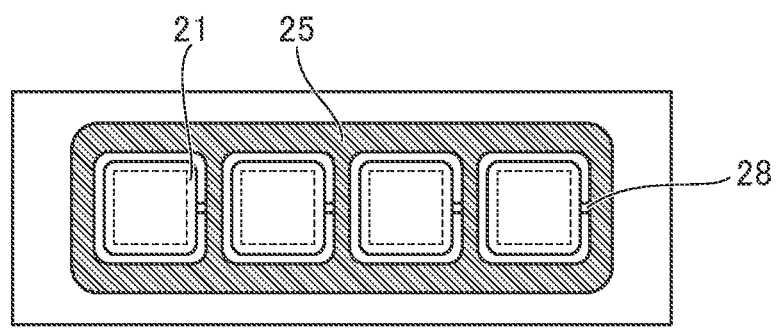
FIG. 6B is a diagram of the D-D cross section in FIG. 6A.
Figure 7:
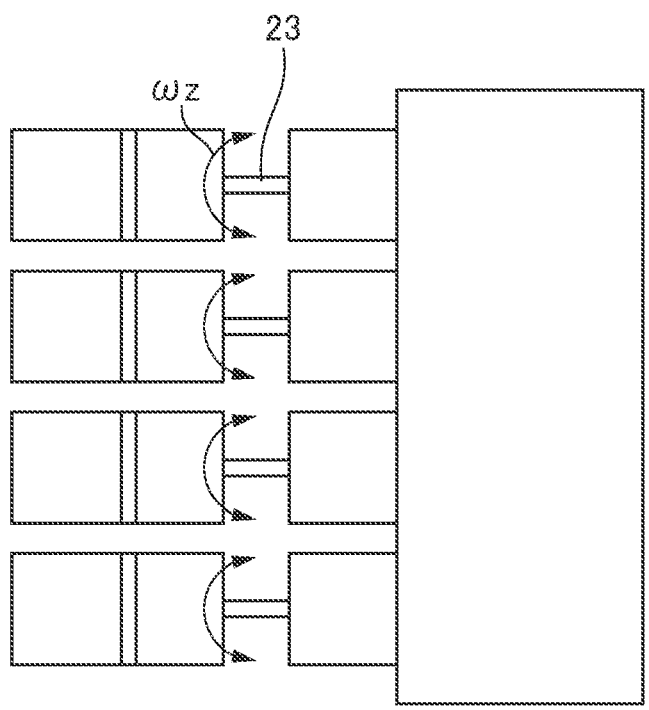
FIG. 7 is a diagram of the C-C cross section in FIG. 3 in the Second Embodiment.

FIG. 6A is a diagram as seen from the direction of the arrow A of FIG. 3 in the Second Embodiment. FIG. 6B is a diagram of the D-D cross section in FIG. 6A. FIG. 7 is a diagram of the C-C cross section in FIG. 3 in the Second Embodiment.

As is shown in FIG. 6A and FIG. 6B, the concave member 30 that is connected to the actuator 16 has a chamber 21 and a flexure unit 23 for each actuator 16.

According to the configuration of the Second Embodiment, it is possible to absorb angle errors in the ωz direction of the side of the mold 3 in relation to each of the contact members 29 that are provided in four locations per one side of the mold 3, which is a total of 16 locations, and to increase their degree of engagement with each other. In addition, as in shown in FIG. 6B, an air vent 28 is provided on the bank 32 so that the pressure of each chamber 21 is the same.

Third Embodiment

Figure 8:
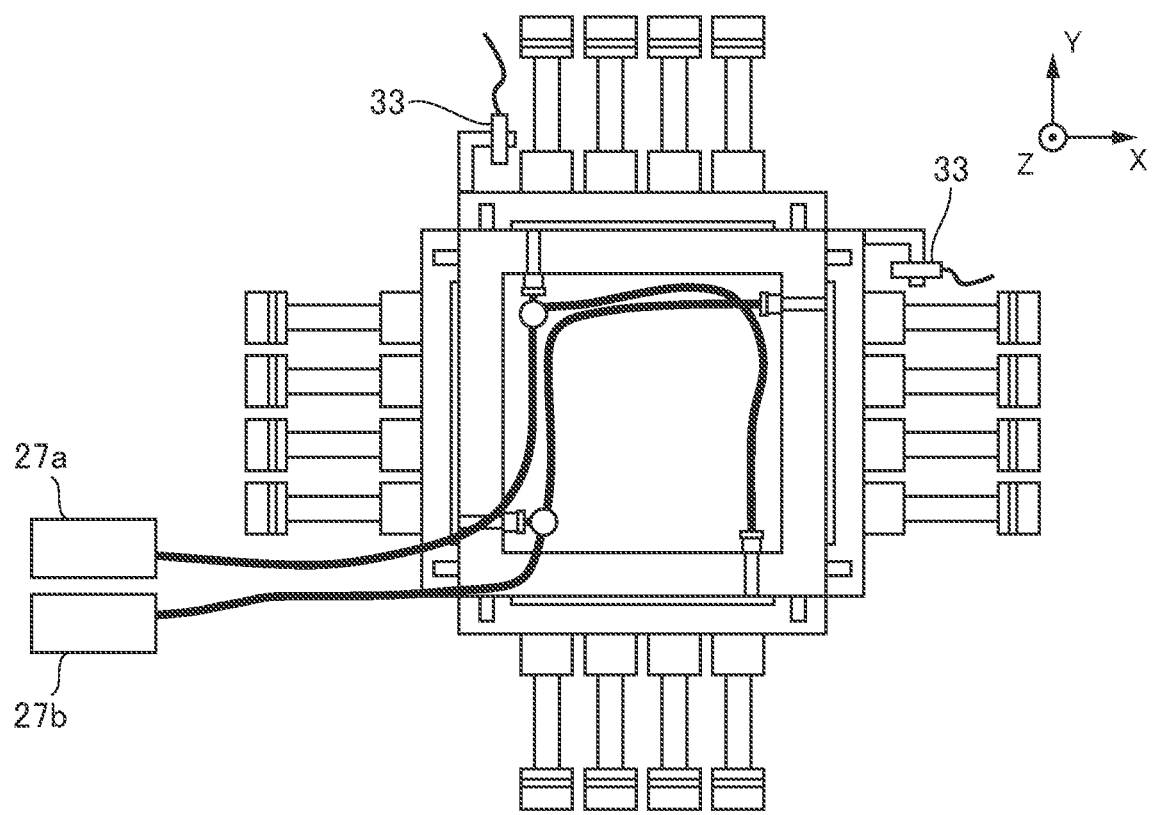
FIG. 8 is a diagram as seen from the direction of the arrow A in FIG. 3 in a Third Embodiment.

Next, an imprint apparatus according to a Third Embodiment of the present invention will be explained using FIG. 8. FIG. 8 is a diagram as seen from the direction of the arrow A in FIG. 3 in the Third Embodiment. The imprint apparatus according to the Third Embodiment is characterized in that the chamber pressure can be separately adjusted in the X direction and the Y direction. As is shown in FIG. 8, the chambers in the two areas of the X direction are connected together, the chambers in the two areas of the Y direction are connected together, and they are respectively connected to a pressure adjustment mechanism 27a and a pressure adjustment mechanism 27b that serve as pressure adjusting units so that the pressure for each can be individually adjusted.

That is, the pressure adjusting unit provides the same shared fluid pressure to the displacement members that have been disposed on the two surfaces that oppose the side of the mold. In contrast, a different fluid pressure is provided to the displacement members that have been disposed on the other two surfaces.

In the Third Embodiment, it is thereby possible to accommodate cases in which the difference in the dimensions of the X direction and the Y direction of the mold 3 is large, or cases in which the desired magnification correction amount is different for the X and Y directions.

Note that in the case in which a displacement member is disposed on each of the four sides of the mold, it may also be made such that a different fluid pressure is provided to the displacement member for each side. In addition, the displacement members that are disposed on each side may also be configured such that the displacement amount for the displacement members on the center of each side is smaller than the displacement amount for the displacement members on the edges of each side. However, it is preferable that the displacement directions of the displacement members are parallel.

Fourth Embodiment

Figure 9:
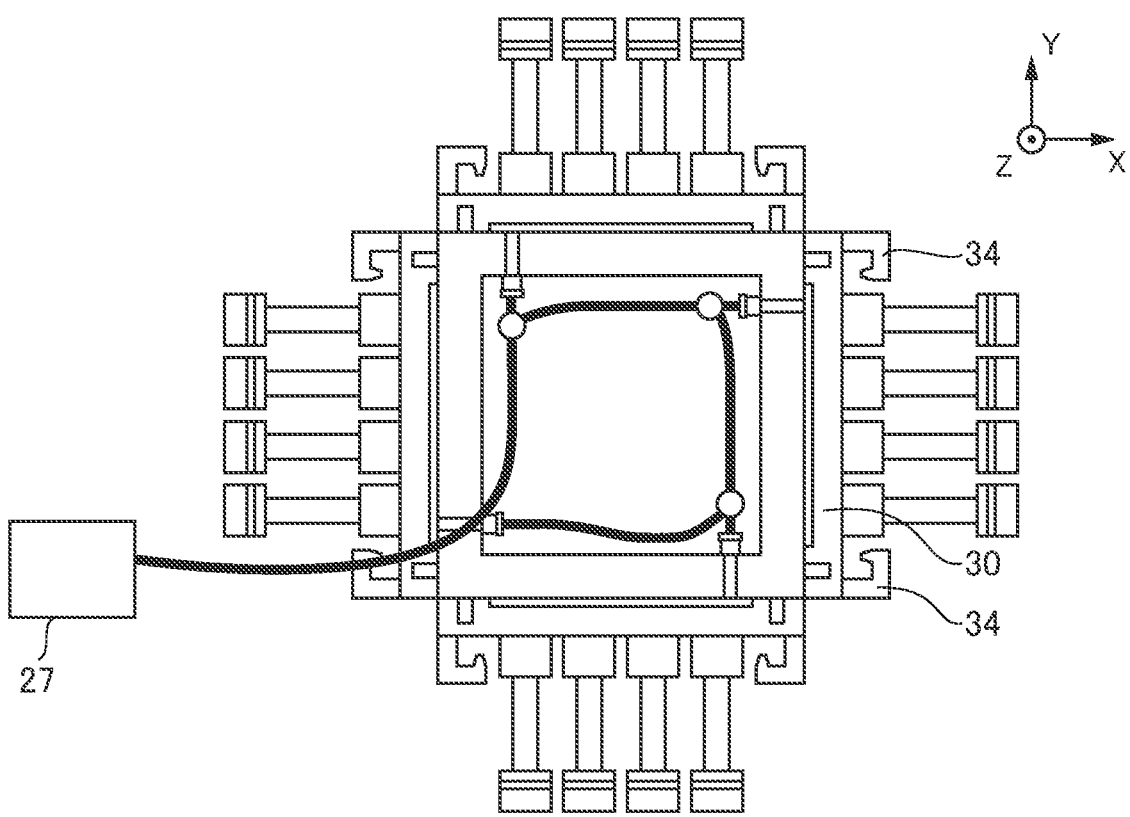
FIG. 9 is a diagram as seen from the direction of the arrow A in FIG. 3 in a Fourth Embodiment.

Next, an imprint apparatus according to a Fourth Embodiment of the present invention will be explained using FIG. 9. FIG. 9 is a diagram as seen from the direction of the arrow A in FIG. 3 in the fourth embodiment. The imprint apparatus according to the Fourth Embodiment is characterized in that stoppers 34 are provided for limiting an upper limit of the deformation amount of the displacement members by restricting the enlargement of the membrane 25 to a set amount. As is shown in FIG. 9, there are stoppers on the outside of the concave members 30 and the enlargement of the membrane 25 is regulated at the stopper position when a set pressure or above is added. Therefore, in the Fourth Embodiment, by more stably regulating the mechanical position with a stopper at a set pressure or above, it is possible to simply perform more precise control than by controlling the position of the actuator 16 by regularly changing the pressure.

Fifth Embodiment

Next, an imprint apparatus according to a Fifth Embodiment of the present invention will be explained using FIG.

Figure 10:
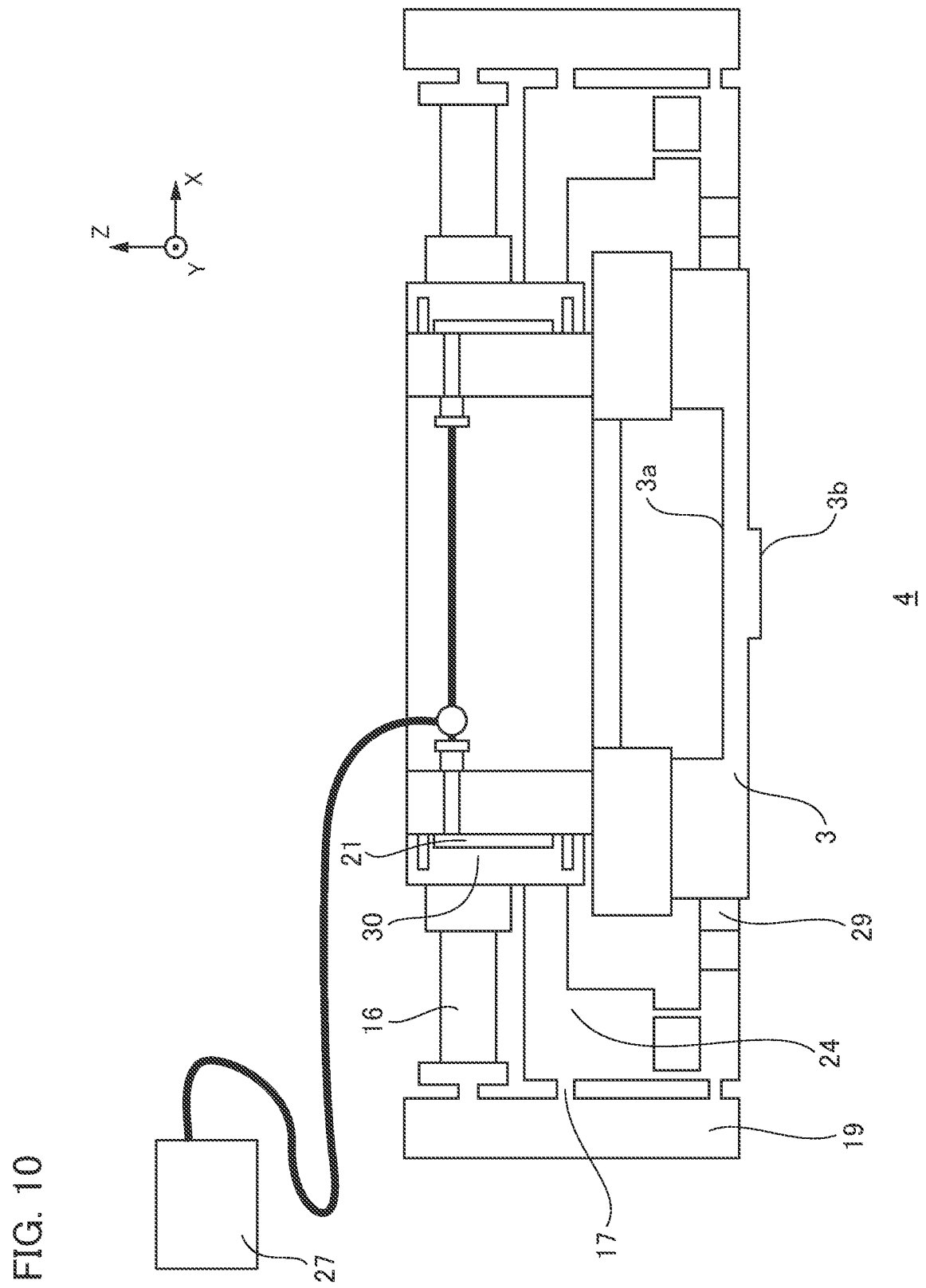
FIG. 10 is a side view diagram of an imprint head 4 and a magnification correction mechanism 11 according to a Fifth Embodiment.

10. FIG. 10 is a side view diagram of an imprint head 4 and a magnification correction mechanism 11 according to the Fifth Embodiment. The imprint apparatus according to the Fifth Embodiment is characterized in that, as is shown in FIG. 10, both the actuator 16 and the base 24 that is connected to the hinge 17 are coupled to the concave member 30.

That is, shared displacement members are provided both between the hinge 17 and the mold holding member 12, and between the actuator 16 and the mold holding member 12. When the pressure of the chamber 21 is changed, the lever 19 will move parallelly to the direction of the X axis in the diagram without rotating. That is, in the Fifth Embodiment, flexure does not act on the hinge 17 even if the chamber pressure changes, and therefore, it is possible to change the distance between the contact member 29 and the mold 3 without applying a load to the hinge 17.

Sixth Embodiment

Figure 11:
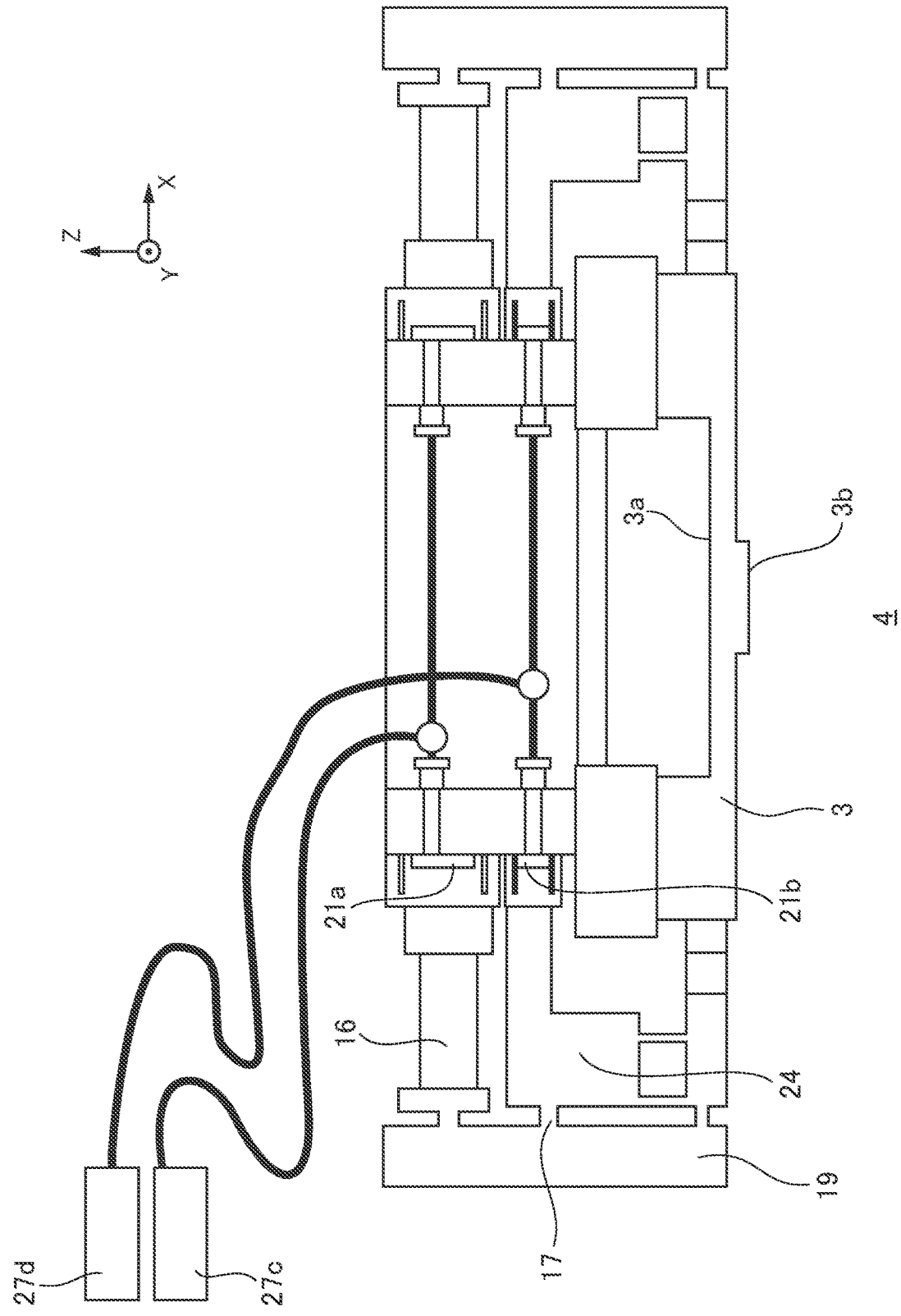
FIG. 11 is a side view diagram of an imprint head 4 and a magnification correction mechanism 11 according to a Sixth Embodiment.

Next, an imprint apparatus according to a Sixth Embodiment of the present invention will be explained using FIG. 11. FIG. 11 is a side view diagram of an imprint head 4 and a magnification correction mechanism 11 according to a Sixth Embodiment. The imprint apparatus according to the Sixth Embodiment is characterized by the point that the position of the hinge 17 and the position of the actuator 16 can be controlled individually. As is shown in FIG. 11, the actuator 16 is connected to the concave member 30a that has the chamber 21a, and the base 24 that is attached to the hinge 17 is connected to the concave member 30b that has the chamber 21b.

The pressure of each chamber is individually connected to both the pressure adjustment mechanism 27 and the pressure adjustment mechanism 27d, and is controlled individually. That is, different displacement members are provided between each of the hinge 17 and the mold holding member 12, and between the actuator 16 and the mold holding member 12, and fluid pressure is provided individually to each of them.

In this manner, according to the configuration of the Sixth Embodiment, in the case in which, for example, positive pressure has been applied to the chamber 21a and negative pressure has been applied to the chamber 21b, greater rotation of the lever 19 can be obtained compared to a case in which positive pressure has been applied to only the chamber 21a, and therefore, the contact member 29 is able to move to the side of the mold 3 in larger strokes. Conversely, in the case in which negative pressure has been applied to the chamber 21a, and positive pressure has been applied to the chamber 21b, a greater drive amount in the direction away from the mold can be obtained.

Seventh Embodiment

Figure 12:
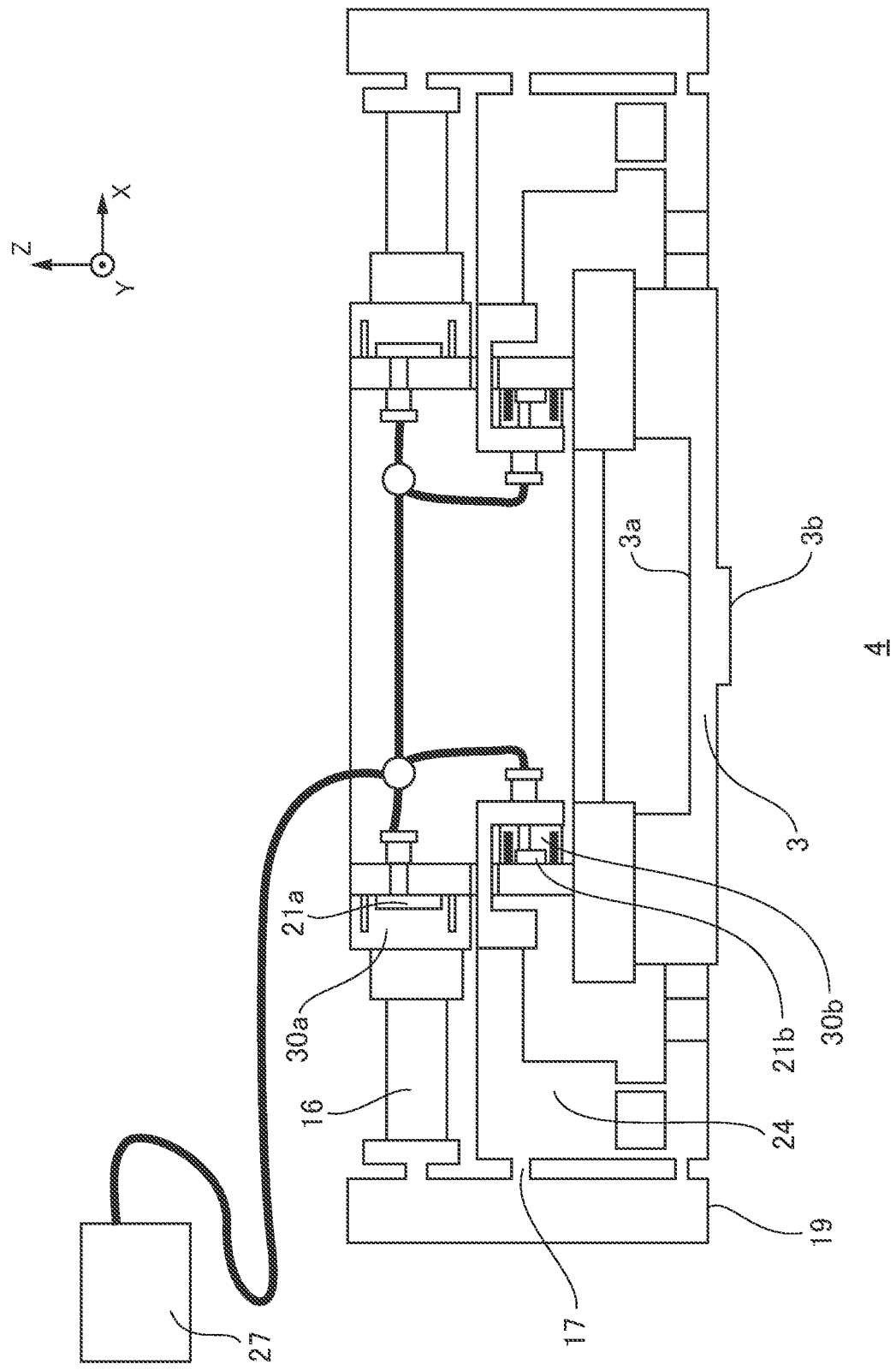
FIG. 12 is a side view diagram of an imprint head 4 and a magnification correction mechanism 11 according to a Seventh Embodiment.

Next, an imprint apparatus according to a Seventh Embodiment of the present invention will be explained using FIG. 12. FIG. 12 is a side view diagram of the imprint head 4 and a magnification correction mechanism 11 according to the Seventh Embodiment. In FIG. 12, the configuration is made such that in the case in which the same pressure has been applied, the actuator 16 and the hinge 17 move in opposing directions. Accordingly, when positive pressure is applied to the chamber 21a and the chamber 21b, the contact member 29 moves to the side of the mold 3, and when negative pressure is applied the contact member 29 moves in the direction away from the mold 3. In this way, according to the configuration of the Seventh Embodiment, it is possible to obtain large strokes even with one pressure adjustment mechanism by the piping being connected to each other and being connected to one pressure adjustment mechanism 27.

That is, different displacement members are provided in mutually opposing directions both between the hinge 17 and the mold holding member 12, and between the actuator 16 and the mold holding member 12, and additionally, shared fluid pressure is provided to both.

Note that it is sufficient if a displacement member is provided in at least one of between the hinge 17 and the mold holding member 12, or between the actuator 16 and the mold holding member 12, and it is possible to change the initial position for starting correction of the contacting portion of the magnification correction mechanism according to the size of the mold.

Figure 13:
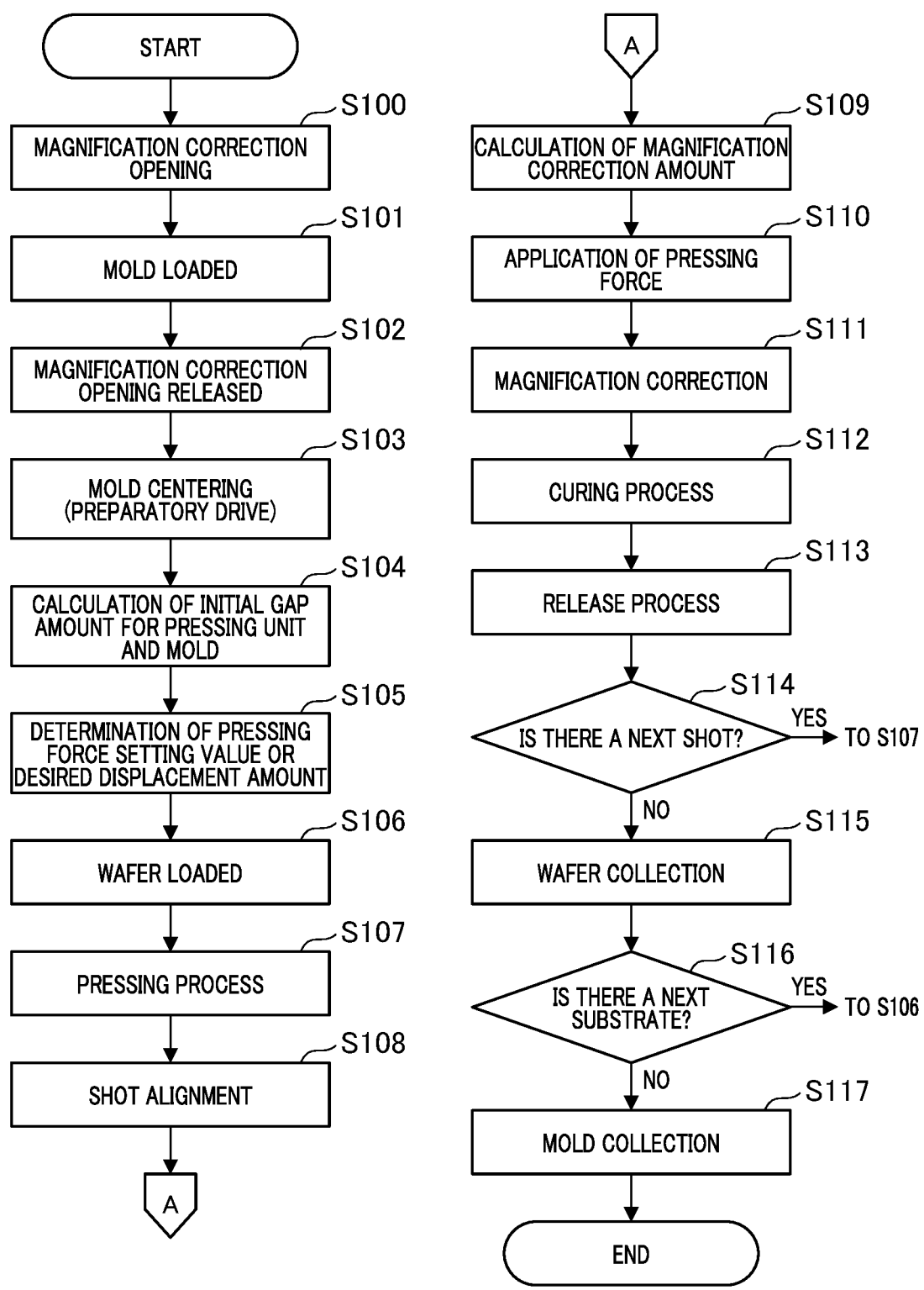
FIG. 13 is a flowchart showing an operations sequence at the time of imprint processing.

Next, the operations of the imprint apparatus 1 in the above embodiment will be explained. FIG. 13 is a flowchart showing a sequence of operations at the time of the imprint processing. That is, FIG. 13 shows a sequence of operations for when a pattern that is a concavo-convex layer is formed on the wafer 5 by imprint processing for a plurality of wafers 5 using the imprint apparatus 1. Note that each step of the operations in FIG. 13 are performed by the internal computer of the control device 9 executing a computer program that has been stored on a memory.

Note that it is assumed that the same mold 3 is used for one lot that includes this plurality of wafers 5.

Firstly, in step S100, the magnification correction mechanism 11 performs an opening operation in order to load the mold 3 onto the mold holding member 12. The opening operation is performed by changing the pressure of the chamber 21 as was described above. In the case in which that alone results in insufficient opening dimensions, the actuator 16 may also be compressed. In the case in which piezo elements are used in the actuator 16, a negative voltage will be applied.

Next, in step S101, the mold 3 is transported to directly under the mold holding member by the mold transport device 8. After this, in step S102, the opening operation is terminated. Next, in step S103, a centering operation for adjusting the position of the mold 3 is performed. In this context, the centering operation refers to a preparatory operation for aligning the mold 3 before pressing is performed. The position of the mold 3 is optimized by the centering operation, and after centering is performed, the output balance of the plurality of actuators 16 and the concave member 30 is optimized.

For example, the contact member 29 contacts the mold 3 by all of the actuators 16 being driven simultaneously, and adjustment is performed such that the output of all of the load cells 26 is a set value at a low level. In addition, adjustment is performed such that the output of all of the load cells 26 is a desired value by changing the pressure of the concave member 30. Next, in step S104, the control device 9 calculates the gap amount for the side of the mold 3 and the contact member 29 for when there is no load based on the relationship between the input amount for the actuator 16, the pressure towards the concave member 30, and the output of the load cells at the time of the centering operation.

For example, in the case in which centering is performed using only the actuator 16, it is possible to perform the calculation based on the stretching amount of the actuator from the time that the load cells 26 of each axel started force detection. The holding force of the mold holding member 12 on the mold 3 is weak at the time of the centering, and the holding force increases after centering is finished. Next, in step S105, the setting value for the fluid pressure inside of the chambers is determined based on the gap amount that has been calculated. The chamber pressure may be made a settings value for a pressure that will deform the concave member 30 until the gap becomes, for example, several um directly before the contact member 29 contacts the mold 3. Conversely, pressure may be directly applied to the chamber space, and the chamber pressure may be made a setting value for a pressure that will start the detection of the output of the load cell 26.

Furthermore, in the case in which the target value for the magnification correction is already clear, an opposing force that is equal to the necessary pressing force will also be applied to the convex members, and therefore, a higher pressure setting value may also be determined taking into account the deformation amount of the concave members that are reduced by being compressed thereby. In this manner, in the present processing, the adjustment operation for adjusting the initial position for starting the correction of the contact members is performed by displacing the displacement members directly after the mold 3 has been installed.

Next, in step S106, the wafer 5 is loaded onto the wafer holding member 15, and in step S107, the pressing process is performed.

In the stamping process of step S107, the control device 9 presses the pattern of the protruding portion 3b of the mold 3 onto the resin 14 on top of the wafer 5 using the pressing actuator 13.

Next, in step S108, during the pressing, shot position marks, which are not illustrated, that have been provided on top of the wafer 5 and on top of the mold 3 are read by an alignment scope 18, and the position of the wafer stage 6 is aligned. Simultaneously to this, in step S109, the magnification correction amount is calculated based on the difference of the shape of the shots of the marks.

Next, in step S110, pressure is applied to the chamber 21 by the pressure adjustment mechanism 27 so that it becomes the pressure setting value that was determined in step S105. After this, in step S111, the actuator 16 is driven so that that the difference in shapes between the wafer 5 and the mold 3 is made as small as possible. In this context, the mold 3 is compressed and deformed based on the drive amount of the actuator 16, and the pattern shape is corrected. In the case in which the drive amount of the actuator 16 is insufficient, further chamber pressure may be additionally applied.

Next, in step S112, the ultraviolet light 10 irradiates the resin 14 of the mold 3 using the lighting system unit 2, and the resin 14 is cured.

Furthermore, in the release process in step S113, the control device 9 releases the pattern of the protruding portion 3b of the mold 3 from the resin 14 on the wafer 5 using the pressing actuator 13. Next, in step S114, the control device 9 executes a determination as to whether or not there is a next shot for forming a pattern on the wafer 5, and in the case in which it has been determined that there is a new shot, the process transitions to step S107.

In the case of No in step S114, that is, the case in which it has been determined that there is not a new shot, in step S115, the control device 9 collects the wafer 5 from the wafer holding member 15 by using a substrate transport mechanism (not illustrated). Next, in step S116, the control device 9 determines if there is a next wafer 5 that will become the processing target, and in the case in which it has been determined that there is a new wafer 5, the processing transitions to step S106. In contrast, in the case in which it has been determined that there is no new wafer 5 in step S116, in step S117, the control device 9 collects the mold 3 from the mold holding member 12 by using the mold transport device 8, and the sequence of operations is completed.

In this manner, in the imprint apparatus 1 of the above-described embodiment, it is possible to bring the contact member 29 towards the side of the mold 3 while controlling the stroke amount of the actuator 16 by adjusting the pressure of the chamber 21 in step S110. It is thereby possible to effectively use the majority of the drive of the actuator 16 in the magnification correction in the following step S111. As a result, it is possible to suppress the deterioration of the overlapping precision that occurs due to insufficient strokes.

In the above manner, according to the above embodiment, it is possible to provide an imprint apparatus 1 that is advantageous in the improvement of the overlapping precision of the mold 3 and the resin 14 on the wafer 5.

Article Manufacturing Method Embodiment

A manufacturing method for a device serving as an article (semiconductor integrated circuit elements, liquid crystal display elements, and the like) includes a pattern forming processing in which a pattern is formed on resin on top of a substrate (wafer, glass plate, film substate) by using the above-described imprint apparatus. Furthermore, this manufacturing method may also include a fabrication process for etching the substrate on which the pattern has been formed. Note that in the case in which other articles such as a patterned media (storage medium), an optical system, or the like are manufactured, instead of etching, this manufacturing method may include other processes that fabricate the substrate on which the pattern has been formed. The article manufacturing method of the present embodiment is advantageous in at least one of the abilities, quality, productivity, or production cost of the article in comparison to conventional methods.

Note that some or all of the control in the present embodiment may be made such that a computer program that realizes the functions of the above-described embodiment is provided to the imprint apparatus or the like via a network or each type of storage medium. In addition, the computer (or the CPU, MPU, or the like) in this imprint apparatus or the like may be made to read out and execute a program. In this case, this program and the storage medium on which this program has been stored configure the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-137299, Aug. 25, 2021, which is hereby incorporated by reference herein in its entirety.

What is claimed is:

1. An imprint apparatus configured to transfer a pattern from a mold onto resin by pressing the mold onto the resin on a surface of a substrate, the imprint apparatus comprising:
   a magnification correction mechanism including a plurality of actuators that apply a force to a side of the mold via a corresponding plurality of contact members, to correct a shape of a patterned portion that has been formed on the mold;

a mold holding member that holds the mold;

a frame that is held by the mold holding member;

a concave member that is fixed to the frame and includes a membrane; and a plurality of displacement members having the concave member that forms a chamber and displaceable by fluid pressure inside the chamber that change an initial position of the plurality of actuators for starting correction of the shape of the patterned portion via the plurality of contact members of the magnification correction mechanism according to a size of the mold, wherein a thickness of the membrane is 2 mm or less.

2. The imprint apparatus according to claim 1, wherein, the plurality of displacement members have a pressure adjusting unit for adjusting the fluid pressure, and the pressure adjusting unit changes a distance between the plurality of contact members and the side of the mold using a corresponding plurality of displacement members by adjusting the fluid pressure.

3. The imprint apparatus according to claim 2, wherein when the mold is exchanged, the pressure adjusting unit displaces the plurality of contact members and the side of the mold in separate directions.

4. The imprint apparatus according to claim 3, wherein after the mold has been installed, the pressure adjusting unit performs an adjustment operation so as to adjust the initial position by displacing the plurality of displacement members.

5. The imprint apparatus according to claim 1, wherein the magnification correction mechanism includes a plurality of levers and a plurality of hinges corresponding to the plurality of actuators, wherein a respective lever of the plurality of levers is able to rotate centered on a respective hinge of the plurality of hinges, and each displacement member of the plurality of displacement members is provided between at least one of the respective hinge and the mold holding member, or between an actuator of the plurality of actuators and the mold holding member.

6. The imprint apparatus according to claim 5, wherein different displacement members of the plurality of displacement members are disposed between different respective hinges of the plurality of hinges and the mold holding member, or between different actuators of the plurality of actuators and the mold holding member, and a shared fluid pressure is provided to the plurality of displacement members.

7. The imprint apparatus according to claim 2, wherein the pressure adjusting unit sets the fluid pressure based on a gap amount between the side of the mold and a contact member of the plurality of contact members.

8. The imprint apparatus according to claim 2, wherein a resolution of the correction of the shape by the magnification correction mechanism is higher than a resolution of the displacement of the plurality of displacement members by the pressure adjusting unit.

9. The imprint apparatus according to claim 2, wherein a responsivity of the correction of the shape by the magnification correction mechanism is higher than a responsivity of a displacement of the plurality of displacement members by the pressure adjusting unit.

10. The imprint apparatus according to claim 2, wherein the plurality of actuators are disposed on four sides of the mold, and the pressure adjustment unit provides shared fluid pressure to displacement members, of the plurality of displacement members, that have been disposed on at least 2 opposing surfaces of the sides of the mold.

11. The imprint apparatus according to claim 1, wherein the plurality of displacement members are displaced parallelly to an expansion direction of the plurality of actuators.

12. The imprint apparatus according to claim 1, wherein the plurality of displacement members are disposed making a position on one edge of the plurality of actuators displaceable.

13. The imprint apparatus according to claim 1, comprising a stopper for limiting an upper limit of a deformation amount of the plurality of displacement members.

14. The imprint apparatus according to claim 1, wherein the plurality of actuators include piezo elements.

15. The imprint apparatus according to claim 1, wherein the plurality of displacement members are displaceable by air pressure.

16. The imprint apparatus according to claim 1, wherein a surface of each of the plurality of displacement members contacts a surface of a corresponding actuator of the plurality of actuators to change the initial position of the plurality of actuators.

* * * * *